(12) United States Patent
Shin et al.

(10) Patent No.: US 9,966,004 B2
(45) Date of Patent: May 8, 2018

(54) ORGANIC LIGHT EMITTING DIODE DISPLAY

(71) Applicant: Samsung Display Co., Ltd., Yongin-si, Gyeonggi-do (KR)

(72) Inventors: Kyung-Soo Shin, Cheonan-si (KR); Do Gi Lim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 138 days.

(21) Appl. No.: 15/056,927

(22) Filed: Feb. 29, 2016

(65) Prior Publication Data

US 2016/0260376 A1 Sep. 8, 2016

(30) Foreign Application Priority Data

Mar. 2, 2015 (KR) .......................... 10-2015-0029338

(51) Int. Cl.
*G09G 3/3225* (2016.01)
*H01L 27/32* (2006.01)
*G09G 3/20* (2006.01)

(52) U.S. Cl.
CPC ......... *G09G 3/3225* (2013.01); *G09G 3/2022* (2013.01); *H01L 27/3276* (2013.01); *G09G 2300/0842* (2013.01); *G09G 2330/08* (2013.01)

(58) Field of Classification Search
CPC ............... G09G 3/3225; G09G 3/2022; G09G 2330/08; G09G 2300/0842; H01L 27/3276
See application file for complete search history.

(56) References Cited

U.S. PATENT DOCUMENTS

| | | | |
|---|---|---|---|
| 9,147,723 B1* | 9/2015 | Lee ........................ | G09G 3/006 |
| 2006/0279478 A1* | 12/2006 | Ikegami ............... | G09G 3/2025 |
| | | | 345/30 |
| 2012/0026144 A1* | 2/2012 | Kang ................... | G09G 3/3225 |
| | | | 345/211 |
| 2013/0135274 A1 | 5/2013 | Choi et al. | |
| 2013/0162619 A1* | 6/2013 | Lee ...................... | G09G 3/3225 |
| | | | 345/212 |
| 2015/0161930 A1* | 6/2015 | Kim ........................ | G09G 3/20 |
| | | | 345/214 |

FOREIGN PATENT DOCUMENTS

| | | |
|---|---|---|
| KR | 10-0698697 B1 | 3/2007 |
| KR | 10-2010-0049385 A | 5/2010 |
| KR | 10-2012-0025301 A | 3/2012 |

* cited by examiner

*Primary Examiner* — Ibrahim A Khan
(74) *Attorney, Agent, or Firm* — Lewis Roca Rothgerber Christie LLP

(57) ABSTRACT

An organic light emitting diode display includes: a substrate comprising a red pixel, a green pixel, and a blue pixel arranged in a matrix; a scan line on the substrate and extending in a row direction; a red data line, a green data line, and a blue data line between adjacent pixel columns to cross the scan line; a driving voltage line alternating with the red data line, the green data line, and the blue data line; and a horizontal driving voltage line extending parallel with the scan line and electrically connected to the driving voltage line.

8 Claims, 9 Drawing Sheets

ORGANIC LIGHT EMITTING DIODE DISPLAY

CROSS-REFERENCE TO RELATED APPLICATION

This application claims priority to and the benefit of Korean Patent Application No. 10-2015-0029338, filed in the Korean Intellectual Property Office on Mar. 2, 2015, the entire content of which is incorporated herein by reference.

BACKGROUND

1. Field

The present disclosure relates to a display device.

2. Description of the Related Art

Organic light emitting diode displays generally include two electrodes and an organic emission layer interposed therebetween. Electrons injected from one of the electrodes that is a cathode and holes injected from the other electrode that is an anode are bonded to each other in the organic emission layer to form excitons, and light is emitted while the excitons discharge energy.

Organic light emitting diode displays generally include a plurality of pixels including an organic light emitting diode that is formed of a cathode, an anode, and an organic emission layer, and a pixel circuit unit including a plurality of transistors and capacitors for driving the organic light emitting diode is formed in each pixel.

A pixel defect may be generated by a characteristic deviation of the transistors and the capacitor in each pixel or a short and/or disconnection of wires. For example, the connection wire between the pixel circuit unit of the defective pixel and the organic light emitting diode may be disconnected, and a dummy circuit unit formed in a peripheral portion of the organic light emitting diode display and the organic light emitting diode may be connected by using a repair line to be driven. Accordingly, the defective pixel can be used as a normal pixel.

Meanwhile, when a short circuit is generated between adjacent signal lines, a laser is irradiated to a gap therebetween to separate the adjacent signal lines.

However, a distance between signal lines becomes narrower in a higher resolution display device. Accordingly, in the case of disconnecting the signal lines, signal lines adjacent thereto may be damaged and there may be particle generation, thereby increasing a probability of a repair failure.

The above information disclosed in this Background section is only for enhancement of understanding of the background of the disclosure and therefore it may contain information that does not constitute prior art.

SUMMARY

The present invention relates to a display device, and an organic light emitting diode display.

Aspects of embodiments of the present invention include an organic light emitting diode display having characteristics of being capable of relatively easily performing a repair even when signal lines are adjacent to each other.

According to aspects of embodiments of the present invention, an organic light emitting diode display includes: a substrate comprising a red pixel, a green pixel, and a blue pixel arranged in a matrix; a scan line on the substrate and extending in a row direction; a red data line, a green data line, and a blue data line between adjacent pixel columns to cross the scan line; a driving voltage line alternating with the red data line, the green data line, and the blue data line; and a horizontal driving voltage line extending parallel with the scan line and electrically connected to the driving voltage line.

The driving voltage line may include an input driving voltage line and an output driving voltage line at opposite sides of at least one data line among the red data line, the green data line, and the blue data line.

The horizontal driving voltage line may include a first horizontal driving voltage line electrically connected to the input driving voltage line and a second horizontal driving voltage line electrically connected to the output driving voltage line.

Each of the red pixel, the green pixel, and the blue pixel may include a switching transistor connected to the scan line and the red data line, the green data line, and the blue data line, and a driving transistor including a control electrode connected to the switching element, an input electrode connected to the driving voltage line, and an output electrode connected to an organic light emitting diode.

The organic light emitting diode may include: a first electrode connected to the output electrode; an organic emission layer formed on the first electrode; and a second electrode formed on the organic emission.

The red data line, the green data line, and the blue data line may be separately formed at an upper portion and a lower portion of the substrate, and may be connected to a data driver formed at the upper side and the lower side of the substrate to use a digital driving method for adjusting a light-emitting time by a switching operation of the driving transistor.

The red data line, the green data line, and the blue data line may be formed at a same layer as that of the driving voltage line by using a same material.

The horizontal driving voltage line may be formed at a same layer as that of the scan line by using a same material.

According to aspects of example embodiments of the present invention, it may be possible to minimize or reduce damage to adjacent data lines caused by a laser by performing a repair process while the instance of a short circuit generated between the data lines may be reduced by alternately arranging the data lines and the driving voltage lines.

In this case, the driving voltage line may be short circuited. However, the driving voltage line has a mesh-type structure, such that a driving voltage is applied to each pixel through other portions, and thus pixels may not be isolated by the short circuit.

DETAILED DESCRIPTION

Figure 1:
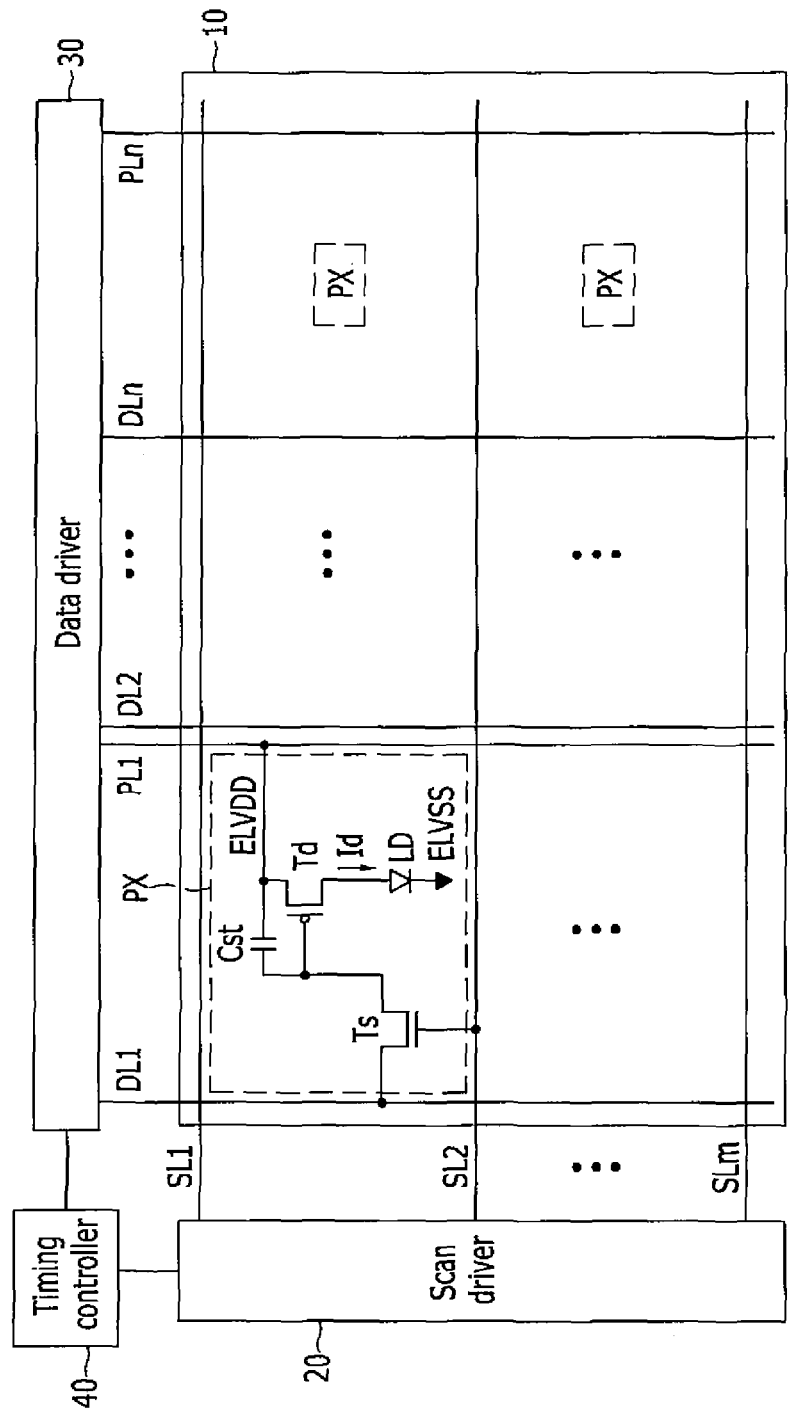
FIG. 1 is a schematic diagram illustrating an organic light emitting diode display according to example embodiments of the present invention.

Aspects of example embodiments of the present invention will be described more fully hereinafter with reference to the accompanying drawings. As those skilled in the art would realize, the described embodiments may be modified in various different ways, all without departing from the spirit or scope of the present invention.

To more clearly describe the present invention, aspects, features, and components that are irrelevant to the description may be omitted, and like numerals refer to like or similar constituent elements throughout the specification.

Further, because sizes and thicknesses of constituent members shown in the accompanying drawings are arbitrarily given for better understanding and ease of description, the present invention is not limited to the illustrated sizes and thicknesses unless stated otherwise.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, the word "on" means positioning on or below the object portion, and does not essentially mean positioning on the upper side of the object portion based on a gravity direction.

In the accompanying drawings, an active matrix (AM) type of organic light emitting diode (OLED) display is illustrated to have a 2Tr-1Cap structure in which two transistors (TFTs) and one capacitor are provided for one pixel, but the present disclosure is not limited thereto. Thus, in the OLED display, each pixel may be provided with a plurality of transistors and at least one capacitor, and may be formed to have various structures by further forming additional wires or omitting existing wires. Herein, the pixel is a minimum unit for displaying an image, and the OLED display displays an image through the pixels.

Hereinafter, an organic light emitting diode display according to an example embodiment of the present invention will be described in more detail with reference to the accompanying drawings.

FIG. 1 is a schematic diagram illustrating an organic light emitting diode display according to an example embodiment of the present invention.

As illustrated in FIG. 1, the organic light emitting diode display according to the example embodiment of the present invention includes an organic light emitting diode display panel 10, a scan driver 20, a data driver 30, and a timing controller 40.

The organic light emitting diode display panel 10 includes a plurality of scan lines SL1 to SLm, a plurality of data lines DL1 to DLn, and a plurality of driving voltage line PL1 to PLn, which are arranged to cross each other so as to define each pixel PX. The scan lines SL1 to SLm substantially extend in a row direction and are parallel or substantially parallel to each other, and the data lines DL1 to DLn and the driving voltage lines PL1 to PLn substantially extend in a column direction and are parallel or substantially parallel to each other.

Each pixel PX includes a plurality of switching transistors Ts that are respectively connected to the scan lines SL1 to SLm and the data lines DL1 to DLn, storage capacitors Cst and driving transistors Td that are respectively connected between the switching transistors Ts and the driving voltage lines PL1 to PLn, and organic light emitting diodes LD that are respectively connected to the driving transistor Td.

The scan driver 20 applies a scan signal to the scan lines SL1 to SLm, and the data driver 30 applies a data signal to the data lines DL1 to DLn.

Each of the switching transistors Ts has a control terminal, an input terminal, and an output terminal such that the control terminal is connected to one of the scan lines SL1 to SLm, the input terminal is connected to one of the data lines DL1 to DLn, and the output terminal is connected to the driving transistor Td. In response to the scan signal applied to the scan lines SL1 to SLm, the switching transistors Ts transmit the data signal applied to the data lines DL1 to DLn to the driving transistor T2

Each of the driving transistors Td also has a control terminal, an input terminal, and an output terminal such that the control terminal is connected to the switching transistor T1, the input terminal is connected to one of the driving voltage lines PL1 to PLn, and the output terminal is connected to the organic light emitting diode OLED.

Each of the organic light emitting diodes LD has an anode connected to the output terminal of the driving transistor Td, and a cathode connected to a common voltage ELVSS.

When the switching transistor Ts is turned on according to the scan signal, the data signal is charged to the storage capacitor Cst and the control terminal of the driving transistor Td, and as a result, the driving transistor Td is turned on to apply the driving voltage ELVDD of the driving voltage lines PL1 to PLn to the organic light emitting diode OLED, thereby allowing the organic light emitting diode LD to emit light.

The timing controller 40 receives image signals and various control signals from an external circuit unit, and generates RGB signals, a data control signal, and a scan control signal to transmit them to the scan driver 20 and the data driver 30.

Figure 2:
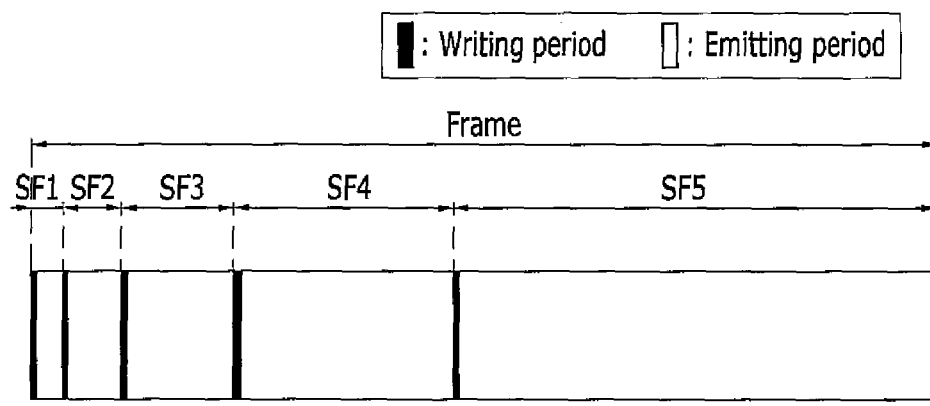
FIG. 2 is a view for describing a digital driving method of an organic light emitting diode display according to example embodiments of the present invention.

FIG. 2 is a diagram for describing a digital driving method of an organic light emitting diode display according to example embodiments of the present invention.

As shown in FIG. 2, in the digital driving method, gray levels of the image can be displayed for each frame that consists of a plurality of sub-fields.

Herein, each sub-field may include a writing period for inputting the data signal to each pixel and an emitting period for allowing the organic light emitting diode OLED to actually emit light, and may further include an erasing period for stopping the light emission of the organic light emitting diode OLED. For example, when 32 gray levels are used to display the image, one frame may be divided into first to fifth sub-fields SF1 to SF5, as shown in FIG. 2, and the first to fifth sub-fields SF1 to SF5 are respectively subdivided into the writing period and the emitting period.

In addition, a length of the emitting period may be adjusted to set a binary weight of the corresponding sub-field. For example, a weight value of the first sub-field SF1 is set to $2^0$ and a weight value of the second sub-field SF2 is set to $2^1$, such that the weight value of each sub-field can be determined to be increased in a ratio of $2^n$ (n=0, 1, 2, 3, 4).

The frame having such a structure May implement the image with a total of 32 gray levels ($=2^5$). For example, when implementing the image of 32 gray levels, all of the sub-fields from the first sub-field SF1 to the fifth sub-field SF5 are on. For example, 32 gray levels can be displayed by supplying the data signal for turning on the organic light emitting diode OLED to the data line for the respective writing periods of the first sub-field SF1 to the fifth sub-field SF5 and allowing the organic light emitting diode OLED to emit light for the respective emitting periods following the respective writing periods.

Alternatively, when the image of 10 gray levels is implemented, the second sub-field SF2 having a weight value of 2 ($=2^1$) and the fourth sub-field SF4 having a weight value of 8 ($=2^3$) may be on. For example, by supplying the data signal for turning on the organic light emitting diode OLED to the data line for the respective writing periods of the second and fourth sub-fields SF2 and SF4 and the data signal for turning off the organic light emitting diode OLED to the data line for the respective writing periods of the first, third, and fifth sub-fields SF1, SF3, and SF5, the organic light emitting diode OLED may be allowed to emit light for the respective emitting periods of the second and fourth sub-fields SF2 and SF4 while not being allowed to emit light for the respective emitting periods of the first, third, and fifth sub-fields SF1, SF3, and SF5, thereby displaying the image at 10 gray levels.

As such, because the data signal applied to each pixel has two voltage values for turning on or turning off the OLED, such a time-division driving method is referred to as the digital driving method.

In FIG. 2, 5-bit driving in which one frame consists of five sub-fields is described as one example, but the number of sub-fields included in one frame may be variously changed. Further, in FIG. 2, an example in which the sub-fields are sequentially arranged in an increasing order of binary weights in one frame is illustrated, but the sub-fields may be sequentially arranged in a decreasing order of binary weights in one frame or may be arranged irrespective of binary weights.

Figure 3:
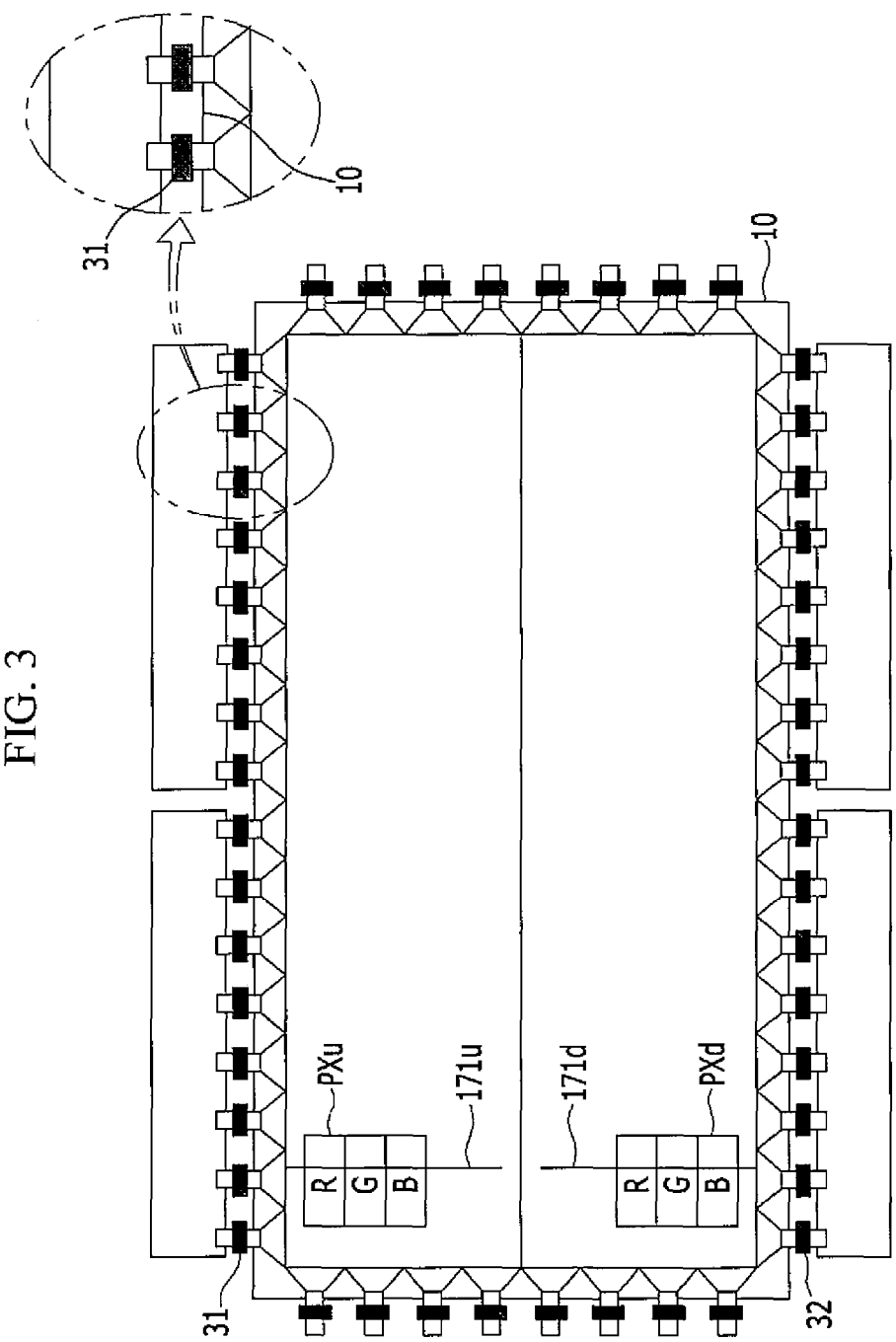
FIG. 3 illustrates a structure in which a data driver is separately arranged or located at an upper side and a lower side of an organic light emitting diode display panel of an organic light emitting diode display according to example embodiments of the present invention.

FIG. 3 illustrates a structure in which a data driver is separately positioned at an upper side and a lower side of an organic light emitting diode display panel of an organic light emitting diode display according to an example embodiment of the present invention.

As shown in FIG. 3, an upper data driver 31 and a lower data driver 32 are respectively attached to upper and lower sides of the OLED display panel 10.

A plurality of pixels PX formed in the organic light emitting diode display panel 10 include upper pixels PXu that are arranged or positioned at an upper half of the organic light emitting diode display panel 10, and lower pixels PXd that are arranged or positioned at a lower half of the organic light emitting diode display panel 10. In order to emit light, upper organic light emitting diodes OLEDu are formed in the upper pixels PXu and lower organic light emitting diodes OLEDd are formed in the lower pixels PXd.

A data line is divided into upper data lines 171u for transmitting data signals to the upper organic light emitting diodes OLEDu of the upper pixels PXu, and lower data lines 171d for transmitting data signals to the lower organic light emitting diodes OLEDd of the lower pixels PXd.

Accordingly, the upper data driver 31 transmits the data signals to the upper organic light emitting diodes of the upper pixels PXu through the upper data lines 171u, and the lower data driver 32 transmits the data signals to the lower organic light emitting diodes of the lower pixels PXd through the lower data lines 171d. As such, because the pixels are separately driven by the organic light emitting diodes of the upper pixels PXu and the lower organic light emitting diodes of the lower pixels PXd, resistance of the data line is reduced to decrease the load of the data line by half.

Hereinafter, a connection relationship between red, green, and blue pixels and signal lines in the organic light emitting diode display illustrated in FIG. 1 will be described in more detail with reference to FIG. 4.

Figure 4:
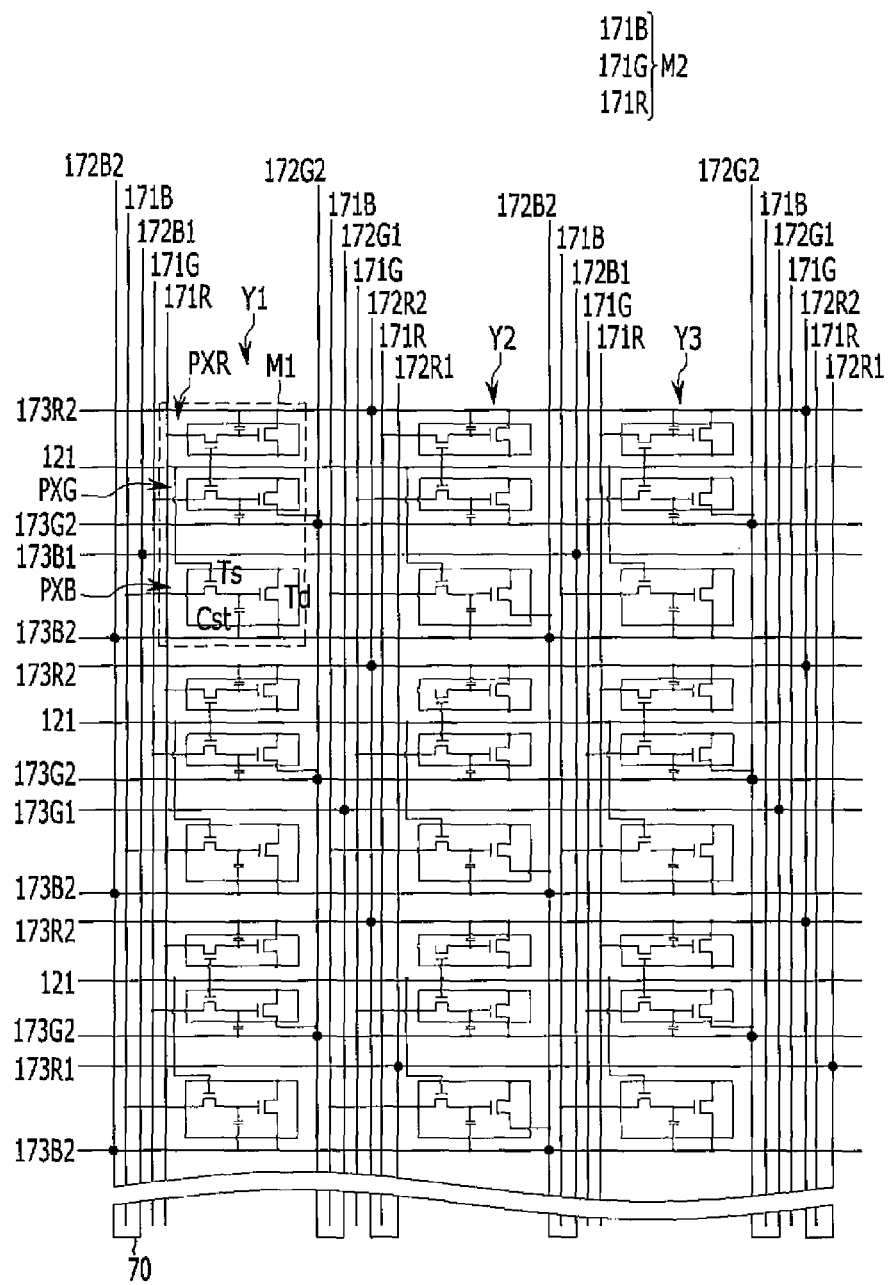
FIG. 4 illustrates a connection relationship between red, green, and blue pixels and signal lines in an organic light emitting diode display according to example embodiments of the present invention.

FIG. 4 illustrates a connection relationship between red, green, and blue pixels and signal lines in an organic light emitting diode display according example embodiments of the present invention.

In the organic light emitting diode display according to some example embodiments of the present invention, the pixels include the upper pixels PXu and the lower pixels PXd. Signal lines of the upper pixels and the lower pixels are connected in the same way, and thus the pixels of FIG. 4 may be the upper or lower pixels. For convenience of description, the pixels of FIG. 4 are integrally referred to as pixels without being divided into upper pixels and lower pixels.

Referring to FIG. 4, red pixels PXR, green pixels PXG, and blue pixels PXB are arranged in a matrix shape. In this case, pixels having a same color are included in one row, and red, green, and blue pixels which are alternately arranged in that order are included in one column.

Each pixel may have a shape in which a row-directional length is longer than a column directional length, and includes a driving transistor Td, a switching transistor Ts, and a capacitor Cst.

Each scan line 121 is arranged or positioned between the row of red pixels PXR and the row of green pixels PXG to extend in the row direction and to be connected to control terminals of the switching transistors Ts of the pixels. When one red pixel PXR, one green pixel PXG, and one blue pixel PXB constitute one unit pixel group M1, one scan line 121 may be connected to all the pixels constituting one unit pixel group M1.

A red data line 171R, a green data line 171G, and a blue data line 171B are arranged or positioned between pixel columns to extend in the column direction and to cross the scan line 121 while being insulated therefrom. When the red data line 171R, the green data line 171G, and the blue data line 171B connected to one unit pixel group M1 constitute one unit data line group M2, the unit data line group M2 is arranged between adjacent pixel columns.

The data lines 171R, 171G, and 171B may be connected to an input terminal of the switching transistor Ts of each pixel. For example, the red data line 171R may be connected to the switching transistors Ts of all the red pixels PXR located at one column, the green data line 171G may be connected to the switching transistors Ts of all the green pixels PXG located at one column, and the blue data line 171B may be connected to the switching transistors Ts of all the blue pixels PXB located at one column.

At least one driving voltage line of red driving voltage lines 172R1 and 172R2, green driving voltage lines 172G1 and 172G2, and blue driving voltage lines 172B1 and 172B2, which are arranged to extend in the column direction and to cross the scan line 121 while being insulated therefrom may be arranged between the pixel columns.

In the driving voltage line connected to the unit pixel group M1, the red driving voltage lines 172R1 and 172R2, the green driving voltage lines 172G1 and 172G2, and the blue driving voltage lines 172B1 and 172B2 are alternately arranged between every adjacent pixel columns For example, this arrangement may be repeatedly performed such that the red driving voltage lines 172R1 and 172R2 and the green driving voltage lines 172G1 and 172G2 are arranged between first adjacent pixel columns, the blue driving voltage lines 172B1 and 172B2 are arranged between second pixel columns, and the red driving voltage lines 172R1 and 172R2 and the green driving voltage lines 172G1 and 172G2 are arranged between third pixel columns.

In the above example embodiment, it is described that the red driving voltage lines 172R1 and 172R2 and the green driving voltage lines 172G1 and 172G2 are arranged between the same adjacent pixel columns, while the blue driving voltage lines 172B1 and 172B2 are arranged between other adjacent pixel columns. However, as necessary, different color driving voltage lines may be arranged between the same adjacent pixel columns.

The driving voltage lines 172R1, 172R2, 172G1, 172G2, 172B1, and 172B2 may be divided into input driving voltage lines 172R1, 172G1, and 172B1 and output driving voltage lines 172R2, 172G2, and 172B2. One end of each of the input driving voltage lines 172R1, 172G1, and 172B1 and the output driving voltage lines 172R2, 172G2, and 172B2 may be electrically connected through an auxiliary connection line 70.

The input driving voltage lines 172R1, 172G1, and 172B further include first horizontal driving voltage lines 173R1, 173G1, and 173B1 which are extended in a direction parallel to the scan line 121, and the output driving voltage lines 172R2, 172G2, and 172B2 further include second horizontal driving voltage lines 173R2, 173G2, and 173B2 which are extended in the direction parallel to the scan line 121.

The input driving voltage lines 172R1, 172G1, and 172B1 and the output driving voltage lines 172R2, 172G2, and 172B2 may be formed at the same layer as that of the data line group M2 by using the same material, and the first horizontal driving voltage lines 173R1, 173G1, and 173B1 and the second horizontal driving voltage lines 173R2, 173G2, and 173B2 may be formed at the same layer as that of the scan line 121 by using the same material.

As a result, the input driving voltage lines 172R1, 172G1, and 172B1 and the first horizontal driving voltage lines 173R1, 173G1, and 173B1 may be respectively electrically connected to each other through contact holes, and the output driving voltage lines 172R2, 172G2, and 172B2 and the second horizontal driving voltage lines 173R2, 173G2, and 173B2 may be respectively electrically connected to each other through contact holes. The contact holes may be formed at portions at which the input driving voltage lines and the output driving voltage lines are arranged to cross the first horizontal driving voltage lines and the second horizontal driving voltage lines.

For example, the output driving voltage lines 172R2, 172B2 are respectively connected to the second horizontal driving voltage lines 173R2, 172B2 through the contact holes 61, 71. And the input driving voltage line 172B1 is connected to the first horizontal driving voltage line 173B1 through the contact hole 63.

The driving transistor Td of each pixel may be electrically connected to the driving voltage lines, and input terminals of the driving transistors Td may be connected to portions extended from the output driving voltage lines 172R2, 172G2, and 172B2 and the second horizontal driving voltage lines 173R2, 173G2, and 173B2 in a direct way or by using a connection pattern.

Meanwhile, the data lines 171R, 171G, and 171B and the driving voltage lines 172R1, 172R2, 172G1, 172G2, 172B1, and 172B2 are arranged together between the pixel columns, and thus the input driving voltage lines 172R1, 172G1, and 172B1, the output driving voltage lines 172R2, 172G2, and 172B2, and the data lines 171R, 171G, and 171B may be alternately arranged.

For example, the red driving voltage lines 172R1 and 172R2, the green driving voltage lines 172G1 and 172G2, and a data line group that is connected to a second pixel column Y2 may be arranged between a first pixel column Y1 and the second pixel column Y2, and the blue driving voltage lines 172B1 and 172B2 and a data line group that is connected to a third pixel column Y3 may be arranged between the second pixel array Y2 and the third pixel array Y3.

In this case, the green output driving voltage line 172G2, the blue data line 171B, the green input driving voltage line 172G1, the green data line 171G, the red output driving voltage line 172R2, the red data line 171R, and the red input driving voltage line 172R1 are arranged in the order of being adjacent to the first pixel array Y1 between the first pixel array Y1 and the second pixel array Y2.

Further, the blue output driving voltage line 172B2, the blue data line 171B, the blue input driving voltage line 172B1, the green data line 171G, and the red data line 171R are arranged in the order of being adjacent to the second pixel array Y2 between the second pixel array Y2 and the third pixel array Y3.

The blue driving voltage lines 172B1 and 172B2 are arranged between the second pixel array Y2 and the third pixel array Y3, and thus no driving voltage line may be arranged between the data lines 171R, 171G, and 171B. Accordingly, data lines connected to pixels of at least two colors may be adjacently arranged.

In FIG. 4, as an example, it is described that the green data line 171G and the red data line 171R may be adjacently arranged, but the present invention is not limited thereto. Alternatively, the blue data line 171B and the green data line 171G may be adjacently arranged, and the blue input driving voltage line 172B1 may be arranged between the green data line 171G and the red data line 171R.

Further, a storage capacitor Cst and an organic light emitting diode connected to an anode are formed at each pixel.

Figure 5:
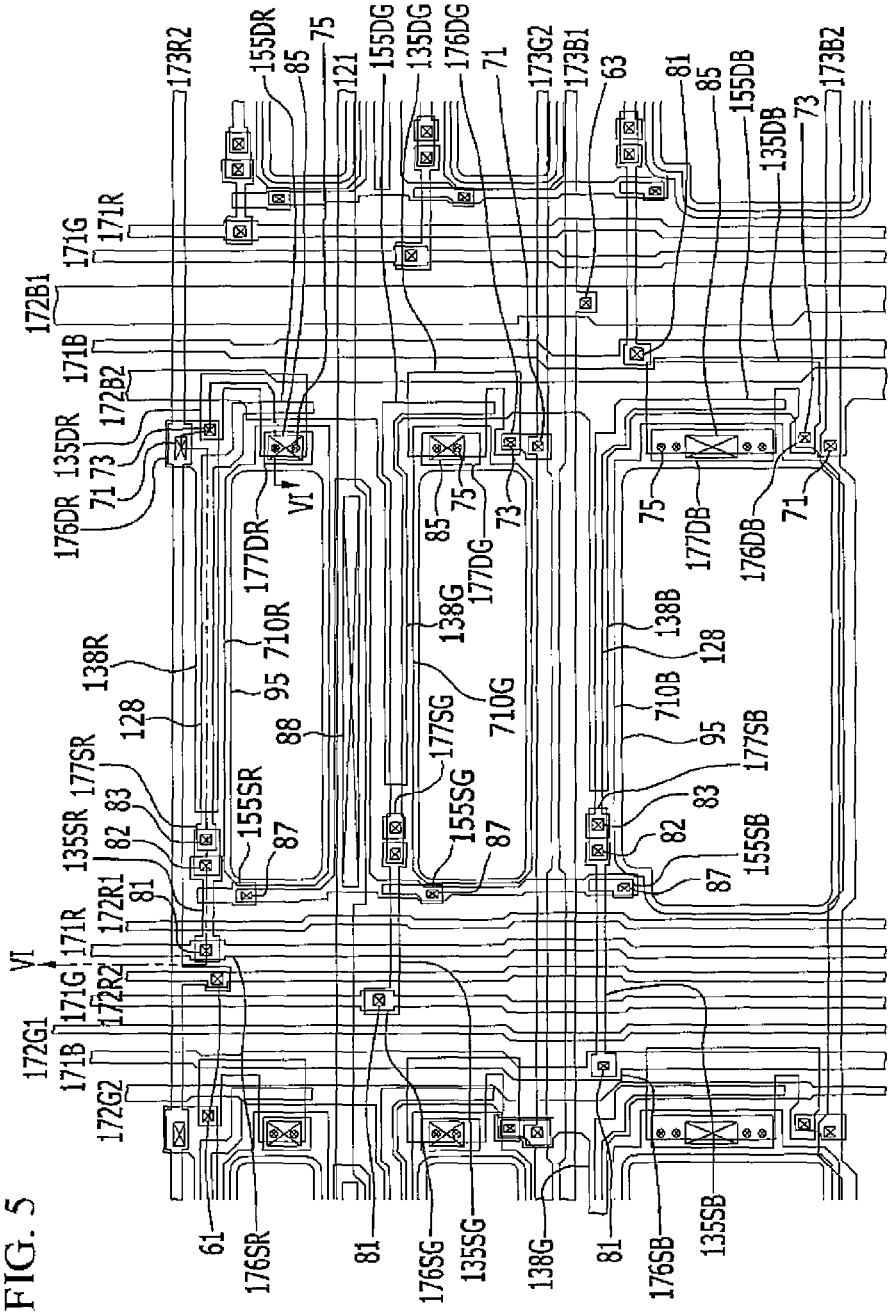
FIG. 5 is a layout of a plurality of pixels included in an organic light emitting diode display according to example embodiments of the present invention.

The data lines 171R, 171G, and 171B and the input driving voltage lines 172R1, 172G1, and 172B1 may have bent portions (see FIG. 5). In this case, two adjacent data lines may be bent in opposite directions. For example, the green data line 171G and the red data line 171R may be formed to be bent in opposite directions. As such, when signal lines are formed to be bendable, a distance between the green data line 171G and the red data line 171R, which are arranged at opposite sides of the red output driving voltage line 172R2, can be increased. Accordingly, instances of a short circuit between two data lines can be prevented or reduced.

Hereinafter, the pixels shown in FIG. 4 will be described with reference to FIG. 5 to FIG. 7.

Figure 6:
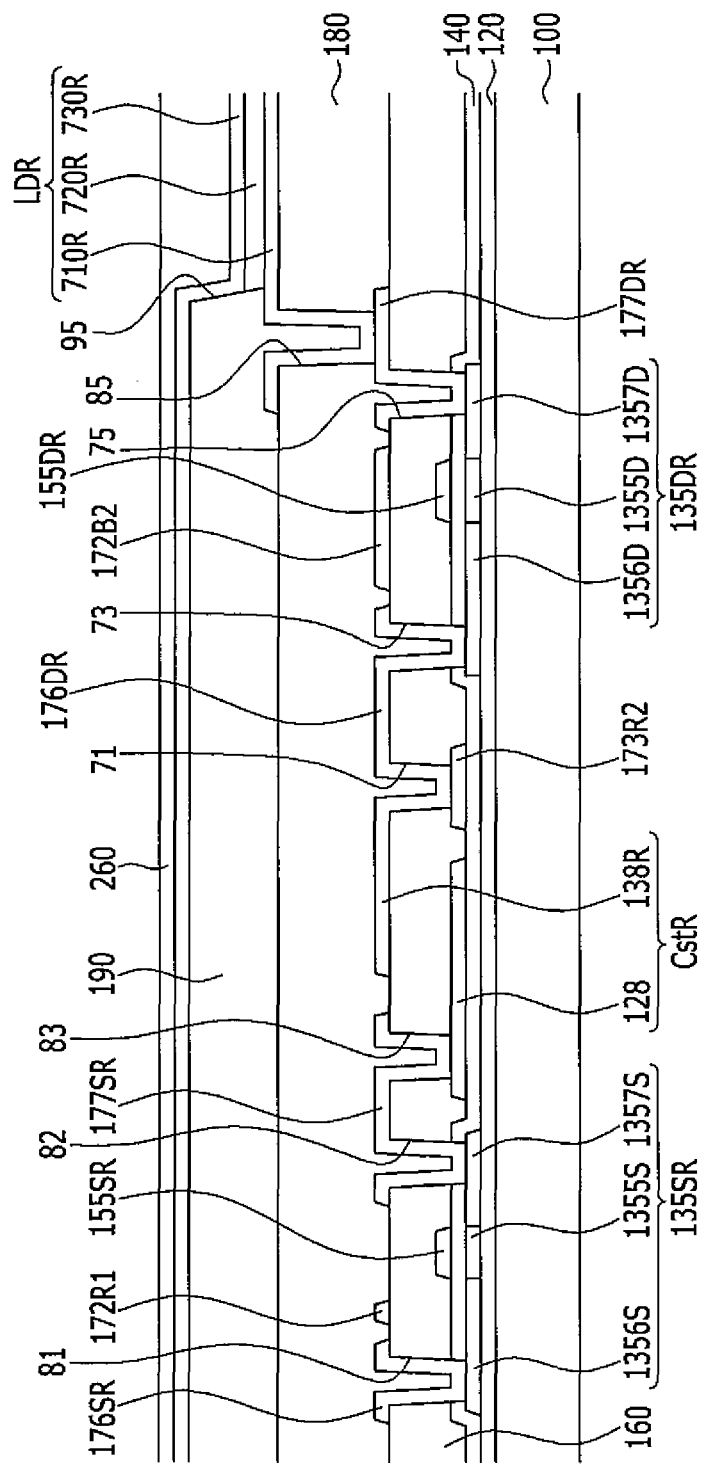
FIG. 6 is a cross-sectional view taken along the line VI-VI of FIG. 5.

FIG. 5 is a layout of a plurality of pixels included in an organic light emitting diode display according to an example embodiment of the present invention, and FIG. 6 is a cross-sectional view taken along the line IV-IV of FIG. 5.

For convenience of description, FIG. 5 illustrates one pixel group among a plurality of pixels and parts of other pixel groups arranged at opposite sides of the one pixel group. Each pixel has the same cross-sectional stacked structure, and thus the cross-sectional structure will be described based on the red pixel.

As shown in FIG. 5 and FIG. 6, in an organic light emitting diode display according to an example embodiment of the present disclosure, a buffer layer 120 is formed on a substrate 100.

The substrate 100 may be a transparent insulating substrate formed of glass, quartz, ceramic, or the like, or may be a metal substrate formed of stainless steel or the like.

Further, the substrate 100 may be a transparent insulation substrate formed of a plastic such as a polycarbonate, a polyimide, or a polyether. The substrate 100 may have a flexible characteristic of, for example, being foldable (bendable), rollable, and stretchable, or may have elasticity in at least one direction.

The buffer layer 120 may be formed in a single layer structure of a silicon nitride (SiNx) or a double layer structure in which a silicon nitride (SiNx) and a silicon oxide (SiOx) are stacked. The buffer layer 120 serves to flatten the surface while simultaneously preventing unnecessary components such as impurities or water from infiltrating.

Semiconductors 135SR, 135DR, 135SG, 135DG, 135SB, and 135DB are formed on the buffer layer 120 for every pixel.

The semiconductors 135SR, 135DR, 135SG, 135DG, 135SB, and 135DB are formed of a polysilicon or oxide semiconductor. The oxide semiconductor may include one or more of oxides based on titanium (Ti), hafnium (Hf), zirconium (Zr), aluminum (Al), tantalum (Ta), germanium (Ge), zinc (Zn), gallium (Ga), tin (Sn), or indium (In), such as zinc oxide (ZnO), indium-gallium-zinc oxide (In-GaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O) indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O) which are complex oxides thereof. In the case where the semiconductor layers 135SR, 135DR, 135SG, 135DG, 135SB, and 135DB are made of the oxide semiconductor, a separate passivation layer may be added in order to protect the oxide semiconductor that is vulnerable to an external environment such as a high temperature.

The semiconductors 135SR, 135DR, 135SG, 135DG, 1358B, and 135DB are divided into channel regions 1355S and 1355D, and source regions 1356S and 1356D and drain regions 1357S and 1357D which are respectively formed at opposite sides of the channel regions 1355S and 1355D. The channel regions 1355S and 1355D of the semiconductors are formed of semiconductors that are not doped with an impurity, i.e., intrinsic semiconductors. The source regions 1356S and 1356D and the drain regions 1357S and 1357D are formed of semiconductors doped with an impurity, i.e., impurity semiconductors. The impurity with which the source regions 1356S and 1356D and the drain regions 1357S and 1357D are doped may be any one of a p-type impurity and an n-type impurity.

A gate insulating layer 140 is formed on the semiconductors 135SR, 135DR, 135SG, 135DG, 135SB, and 135DB. The gate insulating layer 140 may be formed of a single layer or a multilayer including at least one of tetraethyl orthosilicate (TEOS), a silicon nitride, or a silicon oxide.

The scan line 121, gate electrodes 155SR, 155DR, 155SG, 155DG, 155SB, and 155DB, a first capacitor electrode 128, the first horizontal driving voltage lines 173R1, 173G1, and 173B1, and the second horizontal driving voltage lines 173R2, 173G2, and 173B2 are formed on the gate insulating layer 140.

The scan line 121, the first horizontal driving voltage lines 173R1, 173G1, and 173B1, and the second horizontal driving voltage lines 173R2, 173G2, and 173B2 are arranged to extend in one direction. The first capacitor electrode 128 is arranged to extend in a direction that is parallel or substantially parallel to the scan line 121.

The gate electrodes 155SR, 155DR, 155SG, 155DG, 155SB, and 155DB are arranged to overlap the channel regions 1355S and 1355D, and one end of each of the gate electrodes 155DR, 155DG, and 155DB is connected to the first capacitor electrode 128. The scan line 121, the gate electrodes 1558R, 155DR, 155SG, 155DG, 155SB, and 155DB, the first capacitor electrode 128, the first horizontal driving voltage lines 173R1, 173G1, and 173B1, and the second horizontal driving voltage lines 173R2, 173G2, and 173B2 may be formed of a single layer or multiple layers of a low resistance material or a highly corrosion-resistant material such as Al, Ti, Mo, Cu, Ni, and alloys thereof.

A first interlayer insulating layer 160 may be formed on the scan lines 121, the gate electrodes 155SR, 155DR, 155SG, 155DG, 155SB, and 155DB, the first capacitor electrode 128, the first horizontal driving voltage lines 173R1, 173G1, and 173B1, and the second horizontal driving voltage lines 173R2, 173G2, and 173B2. Similar to the gate insulating layer 140, the first interlayer insulating layer 160 may be formed of a single layer or a multilayer including at least one of tetraethyl orthosilicate (TEOS), a silicon nitride, and a silicon oxide.

The first interlayer insulating layer 160 and the gate insulating layer 140 have a source contact hole 81 and a drain contact hole 82 for respectively exposing the source region 1356S and the drain region 1357D of the switching transistor, and a source contact hole 73 and a drain contact hole 75 for respectively exposing the source region 1356D and the drain region 1357D of the driving transistor.

Further, the first interlayer insulating layer 160 has a contact hole 83 for exposing the first capacitor electrode 128, a contact hole 63 for exposing the first horizontal driving voltage line 173B1, a contact hole 88 for exposing the scan line 121, a contact hole 87 for exposing the gate electrodes 155SR, 155SG, and 155SB of the switching transistor, and a contact hole 71 for exposing the second horizontal driving voltage lines 173R2, 173G2, and 173B2.

The data lines 171R, 171G, and 171B having source electrodes 176SR, 176SG, and 176SB; the input driving voltage lines 172R1, 172G1, and 172B1; the output driving voltage lines 172R2, 172G2, and 172B2 having source electrodes 176DR, 176DG, and 176DB; drain electrodes 177SR, 177SG, 177SB, 177DR, 177DG, and 177DB; and second capacitor electrodes 138R, 138G, and 138B are formed on the first interlayer insulating layer 160.

Source electrodes 176SR, 176SG, and 176SB of the switching transistors may be formed to have a width that is wider than widths of the data lines 171R, 171G, and 171B for easy contact, and are connected to the source region 135 6S through the contact holes 81. Further, the source electrodes 176DR, 176DG, and 176DB of the driving transistors are connected to the source region 135 6D through the contact holes 73.

The drain electrodes 177SR, 177SG, and 177SB of the switching transistors are connected to the drain region 1357D and the first capacitor electrode 128 through the contact holes 82 and 83. The drain electrodes 177DR, 177DG, and 177DB of the driving transistors are connected to the drain region 1357D through the contact holes 75.

The data lines 171R, 171G, and 171B having source electrodes 176SR, 176SG, and 176SB; the input driving voltage lines 172R1, 172G1, and 172B1; the output driving voltage lines 172R2, 172G2, and 172B2 having source electrodes 176DR, 176DG, and 176DB; and the drain electrodes 177SR, 177SG, 177SB, 177DR, 177DG, and 177DB may be formed of a single layer or multiple layers of a low resistance material or a highly corrosion-resistant material such as Al, Ti, Mo, Cu, Ni, and alloys thereof. For example, they may be a triple layer of Ti/Cu/Ti, Ti/Ag/Ti, or Mo/Al/Mo.

The gate electrodes 155SR, 155DR, 155SG, 155DG, 155SB, and 155DB, the source electrodes 176SR, 176SG, 176SB, 176DR, 176DG, and 176DB, and the drain electrodes 177SR, 177SG, 177SB, 177DR, 177DG, and 177DB serve as the control terminals, the input terminals, and the output terminals shown in FIG. 1, and constitute a thin film transistor together with the semiconductors 135SR, 135DR, 135SG, 135DG, 135SB, and 135DB. The channels of the thin film transistors are formed in the semiconductors 135SR, 135DR, 135SG, 135DG, 135SB, and 135DB between the source electrodes 176SR, 176SG, 176SB, 176DR, 176DG, and 176DB and the drain electrodes 177SR, 177SG, 177SB, 177DR, 177DG, and 177DB.

The second capacitor electrodes 138R, 138G, and 138B are connected to the output driving voltage lines, and the second capacitor electrodes 138R, 138G, and 138B are respectively arranged to overlap the first capacitor electrode 128, thereby constituting storage capacitors CstR, CstG, and CstB. The storage capacitance is determined by charged electric charges of the storage capacitors CstR, CstG, and CstB and the voltage applied between the first capacitor electrode 128 and the second capacitor electrodes 138R, 138G, and 138B.

Accordingly, the storage capacitors CstR, CstG, and CstB respectively store storage capacitance corresponding to a difference between a driving voltage ELVDD transferred to the second capacitor electrode 138R, 138G, and 138B through driving voltage lines and a gate voltage of the gate electrodes 155DR, 155DG, and 155DB of the driving transistors.

The second capacitor electrode 138R may be formed to extend along the first capacitor electrode 128 so as to overlap the first capacitor electrode 128, and may have one end that is connected to the second horizontal driving voltage line 173R2 through the contact hole 71. Further, the second capacitor electrodes 138G and 138B may be protruded from the green output driving voltage line 172G2 or the blue output driving voltage line 172B2 toward the first capacitor electrode 128 to overlap the first capacitor electrode 128.

A second interlayer insulating layer 180 is formed on the data lines 171R, 171G, and 171B having source electrodes 176SR, 176SG, and 176SB; the input driving voltage lines 172R1, 172G1, and 172B1; the output driving voltage lines 172R2, 172G2, and 172B2 having source electrodes 176DR, 176DG, and 176DB; the drain electrodes 177SR, 177SG, 177SB, 177DR, 177DG, and 177DB; and the second capacitor electrodes 138R, 138G, and 138B. The second interlayer insulating layer 180 has contact holes 85 for respectively exposing the drain electrodes 177DR, 177DG, and 177DB of the driving transistors.

Similar to the first interlayer insulating layer 160, the second interlayer insulating layer 180 may be formed of a single layer or a multilayer including at least one of tetraethyl orthosilicate (TEOS), a silicon nitride, or a silicon oxide, and may be made of a low dielectric constant organic material.

First electrodes 710R, 710G, and 710B are formed on the second interlayer insulating layer 180. The first electrodes 710R, 710G, and 710B may be electrically connected to the drain electrodes 177DR, 177DG, and 177DB through the contact holes 85, and may serve as an anode of the organic light emitting element of FIG. 1.

A pixel definition layer 190 is formed on the first electrodes 710R, 710G, and 710B.

The pixel definition layer 190 has openings 95 for exposing the first electrodes 710R, 710G, and 710B. The pixel definition layer 190 may be made of a resin such as a polyacrylate resin or a polyimide resin, a silica-based inorganic material, or the like.

Organic emission layers 720R is formed in the openings 95 of the pixel definition layer 190.

Organic emission layers 720R is formed to include a plurality of layers including one or more of an emission layer, a hole injection layer (HIL), a hole transport layer (HTL), an electron transport layer (ETL), and an electron injection layer (EIL).

In the case where the organic emission layers 720R includes all of them, the hole injection layer can be placed on the pixel electrode 710, that is, the anode, and the hole transport layer, the emission layer, the electron transport layer, and the electron injection layer can be sequentially stacked over the hole injection layer.

Second electrodes 730R are formed on the pixel definition layer 190 and the organic emission layers 720R, 720G, and 720B.

The second electrodes 730R, 730G, and 730B serve as a cathode of the organic fight emitting diode. Accordingly, the first electrodes 710R, 710G, and 710B, the organic emission layers 720R, 720G, and 720B, and the second electrodes 730R, 730G, and 730B respectively constitute organic light emitting diodes LD.

The organic light emitting diode display can be of one of a front display type, a rear display type, and a dual-sided display type according to the direction in which the organic light-emitting diode LD emits light.

In the case of the front display type, the first electrodes 710R, 710G, and 710B are formed of a reflective layer, and the second electrodes 730R, 730G, and 730B are formed of a transflective layer or a transmissive layer. In the case of the rear display type, the first electrodes 710R, 710G, and 710B are formed of a transflective layer, and the second electrodes 730R, 730G, and 730B are formed of a reflective layer. In the case of the dual-sided display type, the first electrodes 710R, 710G, and 710B and the second electrodes 730R, 730G, and 730B are formed of a transparent layer or a transflective layer.

The reflective layer and the semi-transparent layer are made of at least one of Mg, Ag, Au, Ca, Li, Cr, and Al, or an alloy thereof. The reflective layer and the transflective layer are determined by the thicknesses thereof, and the transflective layer may have a thickness of less than 200 nm. While the transmittance of the reflective layer or transflective layer increases as the thickness thereof decreases, the resistance thereof increases when the layer is excessively thin.

The transmissive layer is made of indium tin oxide (ITO), indium zinc oxide (IZO), zinc oxide (ZnO), or indium oxide ($In_2O_3$).

An encapsulation layer 260 is formed on the second electrodes 730R, 730G, and 730B.

The encapsulation layer 260 may be formed by alternately forming at least one organic layer and at least one inorganic layer. The inorganic layer or the organic layer may be provided in plural.

The organic layer is formed of a polymer, and according to some example embodiments, may be a single layer or a laminated layer formed of any one of polyethylene terephthalate, a polyimide, a polycarbonate, an epoxy, a polyethylene, and a polyacrylate. According to some embodiments, the organic layer may be formed of a polyacrylate, and for example, it may include a material of a monomer composition including a diacrylate-based monomer and a triacrylate-based monomer that are polymerized. A monoacrylate-based monomer may be further included in the monomer composition. Further, a known photoinitiator such as TPO may be included in the monomer composition, but is not limited thereto.

The inorganic layer may be a single layer or a laminated layer including a metal oxide or a metal nitride. For example, the inorganic layer may include at least one of $SiN_x$, $Al_2O_3$, $SiO_2$, or $TiO_2$.

An uppermost layer of the encapsulation layer, which is exposed to the outside, may be formed of an inorganic layer in order to prevent or reduce permeation of moisture or external contaminants to the organic light emitting diode.

The encapsulation layer may include at least one sandwich structure in which at least one organic layer is inserted between at least two inorganic layers. In addition, the encapsulation layer may include at least one sandwich structure in which at least one inorganic layer is inserted between at least two organic layers.

Hereinafter, a method for performing a repair process by the aforementioned organic light emitting diode display will be described in more detail.

Figure 7:
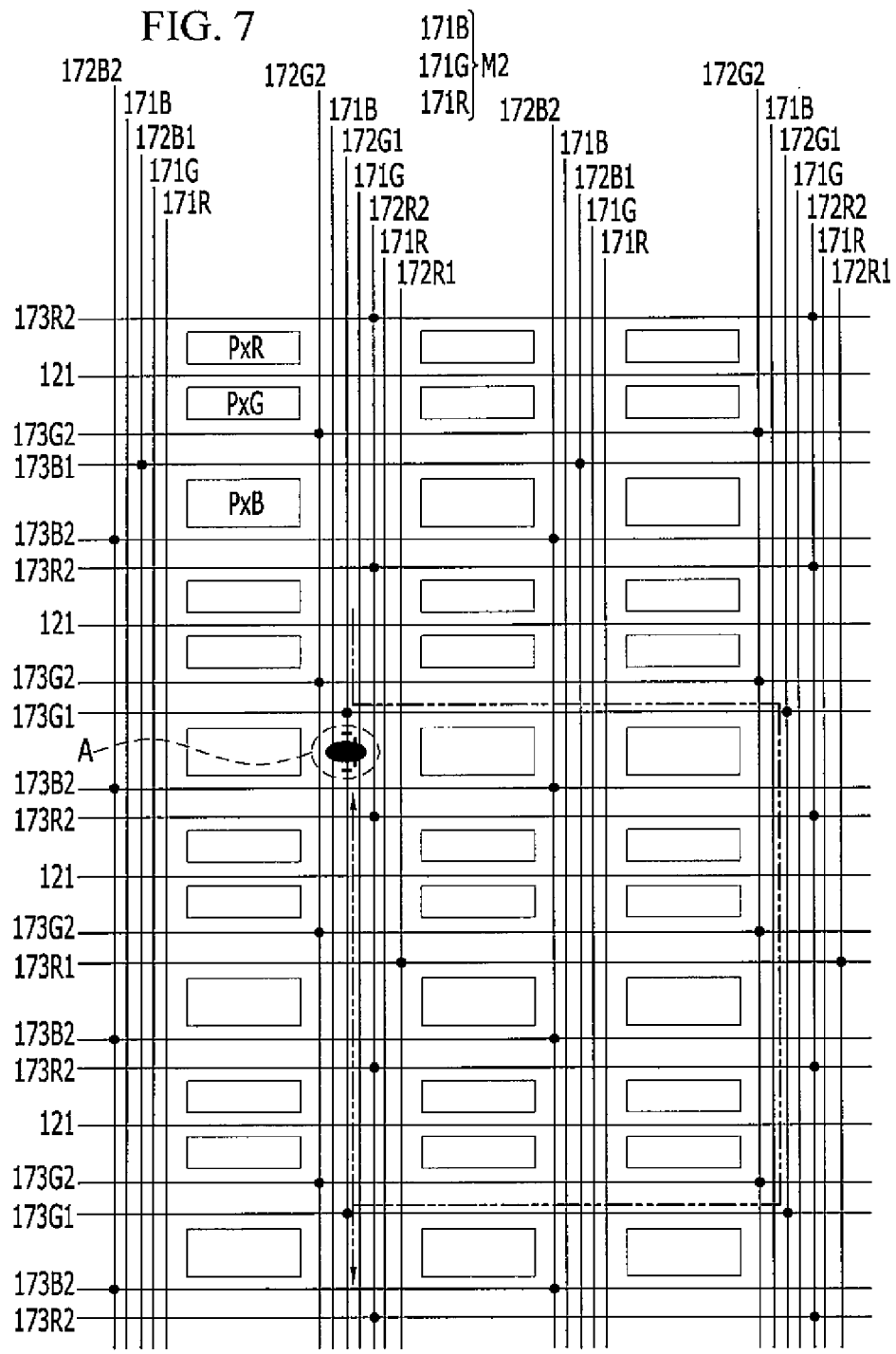
FIG. 7 is a view for describing a repair method using the organic light emitting diode display illustrated in FIG. 5.
Figure 8:
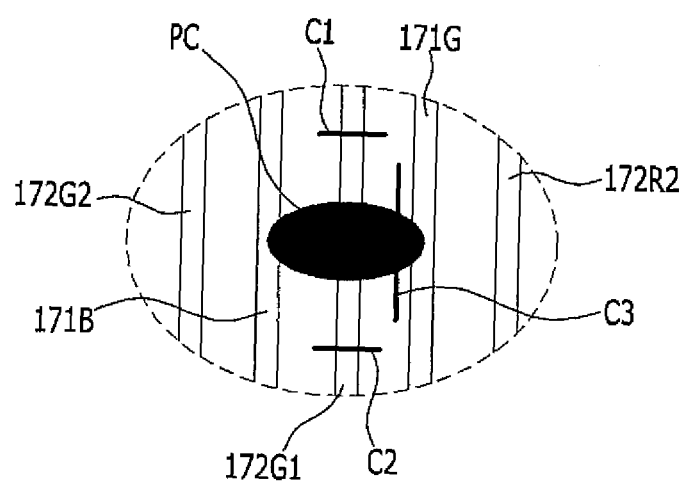
FIG. 8 is an enlarged view of the portion A of FIG. 7.
Figure 9:
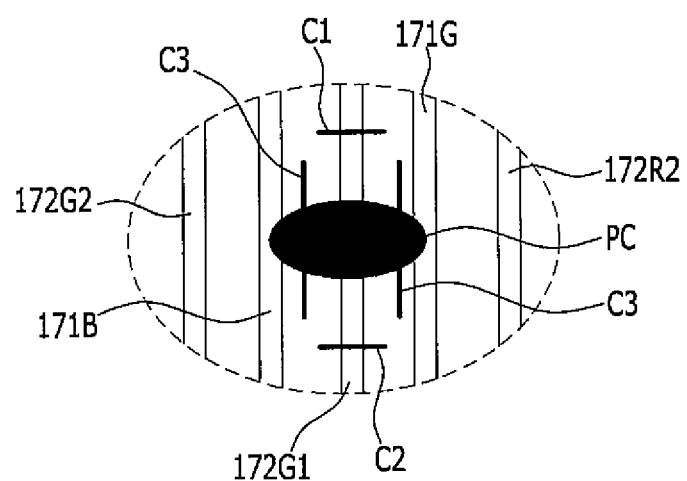
FIG. 9 is an enlarged view of the portion A of FIG. 7 according to example embodiments of the present invention.

FIG. 7 is a view for describing a repair method using the organic light emitting diode display illustrated in FIG. 5, FIG. 8 is an enlarged view of a portion A of FIG. 7, and FIG. 9 is an enlarged view of a portion A of FIG. 7 according to another example embodiment of the present disclosure.

As shown in FIG. 7, a data line group M2 and a driving voltage line are arranged between two adjacent pixel columns.

The data lines 171R, 171G, and 171B, the green driving voltage lines 172G1 and 172G2, and the red driving voltage lines 172R1 and 172R2 may be arranged. Further, the data lines and the driving voltage lines are alternately arranged.

FIG. 7 illustrates an example in which a short circuit is generated between a blue data line and a green data line. This short-circuit is generated by, for example, etching defects or particles generated in the process, and a case where a short circuit is generated between a blue data line 171B and a green data line 171G is illustrated in FIG. 7. In this case, a green input driving voltage line 172G1 arranged therebetween may be short-circuited together.

As such, when a data line is short-circuited, all of the pixels connected to the short-circuited data line may become defective, and disconnection is performed by removing defective patterns or particles positioned between data lines by use of a laser, thereby performing the repair.

In this case, the disconnection may be performed by irradiating a laser between the blue data line 171B and the green input driving voltage line 172G1 and between the green data line 171G and the green input driving voltage line 172G1.

A first point C1 and a second point C2 positioned at an upper portion and a lower portion of the portion that is short-circuited to disconnect the driving voltage line 172G1 are cut. Further, a third portion C3 is cut to separate a signal line connected by particles PC.

When the blue data line 171B and the green data line 171G are short-circuited, the third point C3 may be formed at at least one point between two data lines. For example, an input driving voltage line arranged between two data lines is cut at the first point C1 and the second point C2 to be isolated, and thus two short-circuited data lines can be completely electrically separated from each other by cutting one point between the two data line.

As shown in FIG. 9, third point C3 may be formed at opposite sides of the isolated input driving voltage line Meanwhile, the driving voltage line is isolated at the portion that is short-circuited by the first point C1 and the second point C2 to disconnect a signal. However, as shown in FIG. 7, the input driving voltage line 172G1 is formed to have a net shape by the first horizontal driving voltage line 173G1. Accordingly, even when the input driving voltage line is partially disconnected, the driving voltage flows as indicated by dotted lines, and thus the driving voltages can be applied to all the pixels.

Generally, when data lines are adjacently arranged, precise irradiation by a laser to short-circuited portions of the two adjacent data lines to be separated may be performed. When a distance between the data lines is narrow, however, the data lines may be damaged by the laser irradiation.

However, according to embodiments of the present invention, the driving voltage line is arranged between two data lines, and thus a space to which a laser is irradiated is two or more times wider than the related art. Accordingly, no data line may be damaged by the laser irradiation.

Further, even when two signal lines are short-circuited by the particles PC generated between the driving voltage line and the data, the space to which the laser can be irradiated can include all spaces formed between the two data lines arranged at opposite sides of the driving voltage line. Accordingly, a repair success rate can be increased by irradiating the laser to prevent or reduce instances of the driving voltage line and the short-circuited data lines being damaged.

Even when the laser is not precisely irradiated between the data lines and the driving voltage line short-circuited by the particles, the driving voltage line may be disconnected at the first portion C1 and the second portion C2. Accordingly, there is no problem. In addition, although the driving voltage line is isolated, the driving voltage line has this net-shaped structure, and thus the driving voltage can be applied to all the pixels.

While the present invention has been described in connection with example embodiments, it is to be understood that the present invention is not limited to the disclosed embodiments, but, on the contrary, is intended to cover various modifications and equivalent arrangements included within the spirit and scope of the appended claims, and their equivalents.

DESCRIPTION OF SOME OF THE SYMBOLS

10: display panel
20: scan driver
30: data driver
31: upper data driver
32: lower data driver
40: timing controller
70: auxiliary connection line
63, 71, 73, 75: 81, 82, 83, 85: contact hole
95: opening
100: substrate
120: buffer layer
121: scan line
128: first capacitor electrode
140: gate insulating layer
160: first interlayer insulating layer
171, 171R, 171G, 171B: data line
171d: lower data line
171u: upper data line
172R1, 172G1, 172B1: input driving voltage line
172R2, 172G2, 172B2: output driving voltage line
173R1, 173G1, 173B1: first horizontal driving voltage line
173R2, 173G2, 173B2: second horizontal driving voltage line
180: second interlayer insulating layer
190: pixel definition layer
260: encapsulation layer
710R, 710G, 710B: first electrode
720R, 720G, 720B: organic emission layer
730R, 730G, 730B: second electrode
1355S, 1355D: channel region
1356S, 1356D: source region
1357S, 1357D: drain region
138R, 138G, 138B: second capacitor electrode

What is claimed is:

1. An organic light emitting diode display comprising:
    a substrate comprising a red pixel, a green pixel, and a blue pixel arranged in a matrix having pixel columns and pixel rows:
    a scan line on the substrate and extending in a row direction;
    a red data line, a green data line, and a blue data line, each of the red data line, the green data line, and the blue data line being directly adjacent ones of the pixel columns and crossing the scan line;
    a driving voltage line between at least two data lines from among the red data line, the green data line, and the blue data line that are between the directly adjacent ones of the pixel columns; and
    a horizontal driving voltage line extending parallel with the scan line and electrically connected to the driving voltage line.

2. The organic light emitting diode display of claim 1, wherein the driving voltage line comprises an input driving voltage line and an output driving voltage line at opposite sides of at least one data line from among the red data line, the green data line, and the blue data line.

3. The organic light emitting diode display of claim 2, wherein the horizontal driving voltage line comprises a first horizontal driving voltage line electrically connected to the input driving voltage line and a second horizontal driving voltage line electrically connected to the output driving voltage line.

4. The organic light emitting diode display of claim 1, wherein each of the red pixel, the green pixel, and the blue pixel comprises:
    a switching transistor connected to the scan line and to a corresponding one of the red data line, the green data line, and the blue data line, and
    a driving transistor comprising a control electrode connected to the switching transistor, an input electrode connected to the driving voltage line, and an output electrode connected to an organic light emitting diode.

5. The organic light emitting diode display of claim 4, wherein the organic light emitting diode comprises:
    a first electrode connected to the output electrode;
    an organic emission layer formed on the first electrode; and
    a second electrode formed on the organic emission layer.

6. The organic light emitting diode display of claim 4, wherein the red data line, the green data line, and the blue data line are separately formed at an upper portion and a lower portion of the substrate and are connected to a data driver formed at an upper side and a lower side of the substrate to use a digital driving method for adjusting a light-emitting time by a switching operation of the driving transistor.

7. The organic light emitting diode display of claim 1, wherein the red data line, the green data line, and the blue data line are formed at a same layer as that of the driving voltage line by using a same material.

8. The organic light emitting diode display of claim 1, wherein the horizontal driving voltage line is formed at a same layer as that of the scan line by using a same material.

* * * * *